United States Patent
Kobayashi

(10) Patent No.: US 9,281,464 B2
(45) Date of Patent: Mar. 8, 2016

(54) PIEZOELECTRIC VIBRATING PIECE AND PIEZOELECTRIC VIBRATOR

(71) Applicant: SII Crystal Technology Inc., Chiba-shi, Chiba (JP)

(72) Inventor: Takashi Kobayashi, Chiba (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 14/639,775

(22) Filed: Mar. 5, 2015

(65) Prior Publication Data
US 2015/0255701 A1  Sep. 10, 2015

(30) Foreign Application Priority Data

Mar. 7, 2014  (JP) ................................ 2014-045508

(51) Int. Cl.
*H01L 41/053*  (2006.01)
*H03H 9/21*  (2006.01)

(52) U.S. Cl.
CPC ............... *H01L 41/053* (2013.01); *H03H 9/21* (2013.01)

(58) Field of Classification Search
CPC ................................ H03H 9/21; H03H 9/215
USPC ..................... 310/370; 331/156–18
See application file for complete search history.

(56) References Cited

U.S. PATENT DOCUMENTS

| | | | | |
|---|---|---|---|---|
| 7,378,778 B2 * | 5/2008 | Ikeda | .................... | H01L 41/312 310/331 |
| 8,922,286 B2 * | 12/2014 | Yamada | .................... | H03B 5/30 310/348 |
| 2005/0062368 A1 * | 3/2005 | Hirasawa | .................. | H03H 9/21 310/370 |
| 2006/0082261 A1 * | 4/2006 | Tanaya | ............... | G01C 19/5607 310/370 |
| 2008/0211350 A1 * | 9/2008 | Tanaya | ..................... | H03H 3/04 310/328 |
| 2009/0167118 A1 * | 7/2009 | Yoshimatsu | ............. | H03H 3/02 310/370 |
| 2011/0068876 A1 * | 3/2011 | Yamada | .................. | H03H 9/215 331/158 |
| 2011/0204985 A1 * | 8/2011 | Yamada | ................... | H03H 3/02 331/156 |
| 2012/0293048 A1 * | 11/2012 | Ueno | ....................... | H03H 9/21 310/344 |
| 2014/0022024 A1 * | 1/2014 | Yamada | .................. | H03B 5/30 331/68 |
| 2014/0292435 A1 * | 10/2014 | Yamada | ................. | H03H 9/215 331/158 |

FOREIGN PATENT DOCUMENTS

JP  2008-72705 A  3/2008
JP  2011-233990 A  11/2011

* cited by examiner

*Primary Examiner* — J. San Martin
(74) *Attorney, Agent, or Firm* — Brinks Gilson & Lione

(57) ABSTRACT

To increase the strength of mounting at the time of mounting a piezoelectric vibrating piece on a package. In a piezoelectric vibrating piece having a pair of support arm portions which are provided with mount electrodes outside a pair of vibrating arm portions, concave portions to which a conductive adhesive used for mounting to the package can penetrate are formed in side end surfaces on the inner sides in a width direction of the respective support arm portions near the mount electrodes.

4 Claims, 9 Drawing Sheets

PIEZOELECTRIC VIBRATING PIECE AND PIEZOELECTRIC VIBRATOR

RELATED APPLICATIONS

This application claims priority under 35 U.S.C. §119 to Japanese Patent Application No. 2014-045508 filed on Mar. 7, 2014, the entire content of which is hereby incorporated by reference.

BACKGROUND OF THE INVENTION

1. Field of the Invention

The present invention relates to a piezoelectric vibrating piece and a piezoelectric vibrator having the same.

2. Description of Related Art

For example, in a cellular phone and portable information terminal apparatuses, a piezoelectric vibrator using crystal and so on is used in many cases as devices used for a time source, a timing source of a control signal and so on, a reference signal source and so on. As a piezoelectric vibrator of this kind, there is known one in which a piezoelectric vibrating piece is hermetically sealed in a package where a cavity is formed.

A so-called side-arm type piezoelectric vibrating piece is known as a piezoelectric vibrating piece (for example, refer to JP-A-2008-72705 (Patent Document 1)). The side-arm type piezoelectric vibrating piece has a pair of vibrating arm portions arranged in parallel to each other at an interval in a width direction, a base portion supporting a base-end portion side of the pair of vibrating arm portions in a cantilever manner and support arm portions (side arms) extended from the base portion outside the pair of vibrating arm portions. Then, the piezoelectric vibrating piece is mounted inside a package by using the support arm portions on both sides as mount portions. Specifically, mount electrodes respectively provided on surfaces near tip ends of the support arm portions on both sides are bonded to electrode pads on a package side through a conductive bonding material such as a conductive adhesive or metal bumps. Accordingly, the piezoelectric vibrating piece can be mounted in the package as well as a voltage can be applied from outside to excitation electrodes on the vibrating arm portions.

Incidentally, a requirement for miniaturization of the piezoelectric vibrating piece is further increasing in recent years, and a bonding area between the piezoelectric vibrating piece and the conductive bonding material is reduced accordingly, the reduction of strength in mounting the piezoelectric vibrating piece is a concern. When the strength in mounting the piezoelectric vibrating piece is reduced, there is a danger that the piezoelectric vibrating piece comes off from a base substrate of the package due to an external shock and so on, and further, positional displacement of the piezoelectric vibrating piece and operation failures of electronic components may occur.

SUMMARY OF THE INVENTION

The present invention has been made for solving the above problems and an object thereof is to provide a piezoelectric vibrating piece capable of increasing the mounting strength on the package and a piezoelectric vibrator including the same.

In order to achieve the above object, the present invention applies the following means.

According to embodiments of the present invention, there is provided a piezoelectric vibrating piece including a pair of vibrating arm portions arranged at an interval in a width direction orthogonal to a thickness direction and extending in a longitudinal direction orthogonal to the thickness direction and the width direction, tip end sides in the extending direction of which are free ends vibrating by setting base end sides as fixed ends, a base portion extending in the width direction to both outer sides of the pair of vibrating arm portions, to which respective base end sides of the pair of vibrating arm portions are integrally connected and fixed, a pair of support arm portions connected to the base portion outside the pair of vibrating arm portions and extending from the base portion to the same side as the pair of vibrating arm portions, two-system excitation electrodes arranged on surfaces of the vibrating arm portions in an insulated state to each other, and a pair of mount electrodes arranged on one surface of two surfaces facing in a thickness direction of the respective support arm portions and respectively conducted to the two-system excitation electrodes, in which the pair of mount electrodes are bonded to respective electrode pads on a package side housing the piezoelectric vibrating piece through a conductive bonding material, and in which concave portions piecing from one surface to the other surface of the support arm portions are formed around the mount electrodes in the respective support arm portions.

According to the above structure, the conductive bonding material penetrates into the concave portions from the surfaces of the support arm portions in which the mount electrodes are formed, thereby expanding the bonding area between the conductive bonding material and the piezoelectric vibrating piece as well as increasing the bonding strength between the conductive bonding material and the piezoelectric vibrating piece. As a result, the strength in mounting the piezoelectric vibrating piece on the package can be increased.

As the concave portions are provided in the support arm portions, it is possible to alleviate the stress of the support arm portions generated at the time of mounting the piezoelectric vibrating piece at portions where the concave portions are provided. As a result, stable vibrating characteristics can be maintained.

Furthermore, as the concave portions are provided in the support arm portions, the effect of vibration attenuation can be fulfilled at portions where the concave portions are provided. Accordingly, it is possible to prevent the transmission of vibration occurring in the vibrating arm portions to the package side through the mount electrodes as much as possible and the effect of vibration leakage prevention can be obtained.

In the embodiment of the present invention, it is preferable that at least one concave portion is provided in a side end surface in the width direction of each support arm portion.

In the above case, as plural concave portions are provided in the side end surfaces in the width direction of respective support arm portions, which is the vibrating direction of the vibrating arm portions, the effect of vibration attenuation can be further fulfilled and the effect of vibration leakage prevention can be increased. As the concave portions are provided in side end surfaces in the width direction of respective support arm portions, the conductive bonding material easily penetrates into the concave portions, which can further increase the bonding strength. It is preferable to provide one concave portion as well as plural concave portions. In both cases, desired effects can be obtained.

In the embodiment of the present invention, it is preferable that at least one concave portion is provided in a side end surface on the vibrating arm portion side in the width direction of each support arm portion.

In the above case, as the concave portion is provided in the side end surface on the vibrating arm portion side in each support arm portion (an inner side of each support arm portion), a bending performance on the inner side in the width direction of the support arm portion in which the concave portion is provided is increased and the effect of absorbing vibration transmitted from the vibrating arm portion arranged inside the pair of support arm portions can be increased.

As the concave portion is provided in the side end surface on the inner side of each support arm portion, the conductive bonding material reaching the side end surface penetrates into the concave portion, therefore, the possibility that the conductive bonding material is adhered to the vibrating arm portion at the time of mounting can be reduced. It is preferable to provide one concave portion as well as plural concave portions. In both cases, desired effects can be obtained.

Also according to the embodiment of the present invention, there is provided a piezoelectric vibrator in which the piezoelectric vibrating piece is housed in a hermetically sealed cavity of a package, in which the two mount electrodes are respectively bonded to the two electrode pads through the conductive adhesive to thereby mount the piezoelectric vibrating piece on the package so that bonded portions are set as support fixing points and that other portions float from the package.

According to the present invention, it is possible to increase the mounting strength on the package.

DETAILED DESCRIPTION OF THE PREFERRED EMBODIMENTS

Hereinafter, embodiments of the present invention will be explained with reference to the drawings.
(Structure of Piezoelectric Vibrator)

Figure 1:
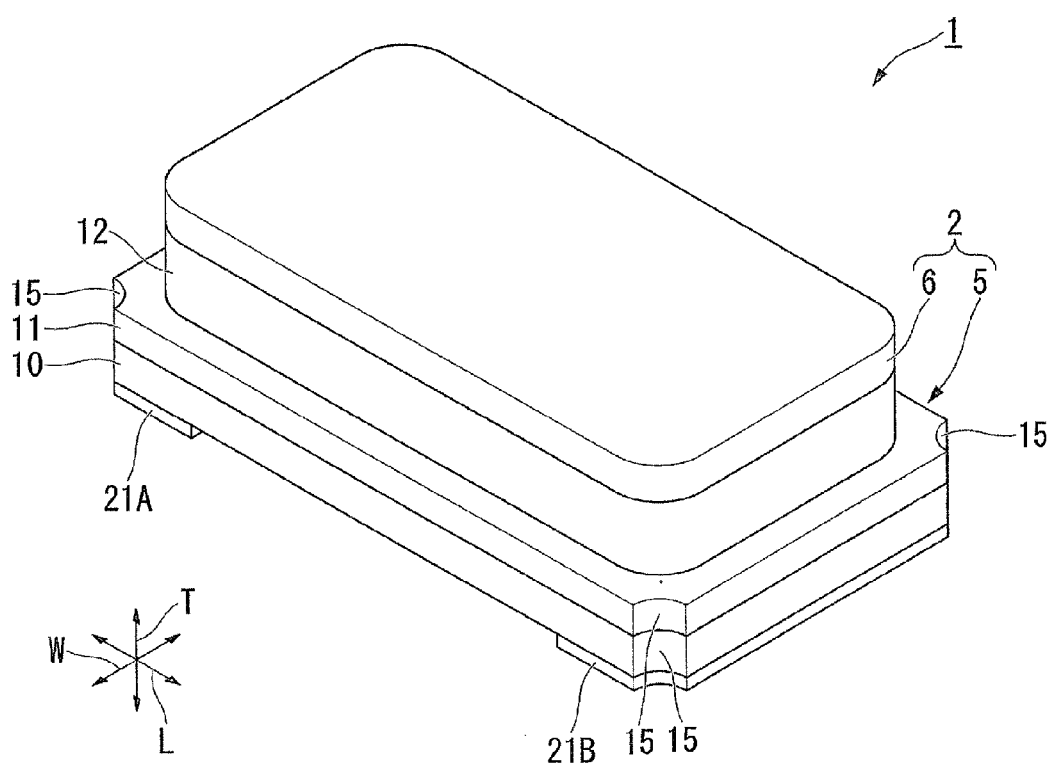
FIG. 1 is an external perspective view of a piezoelectric vibrator having a piezoelectric vibrating piece according to an embodiment of the present invention.
Figure 2:
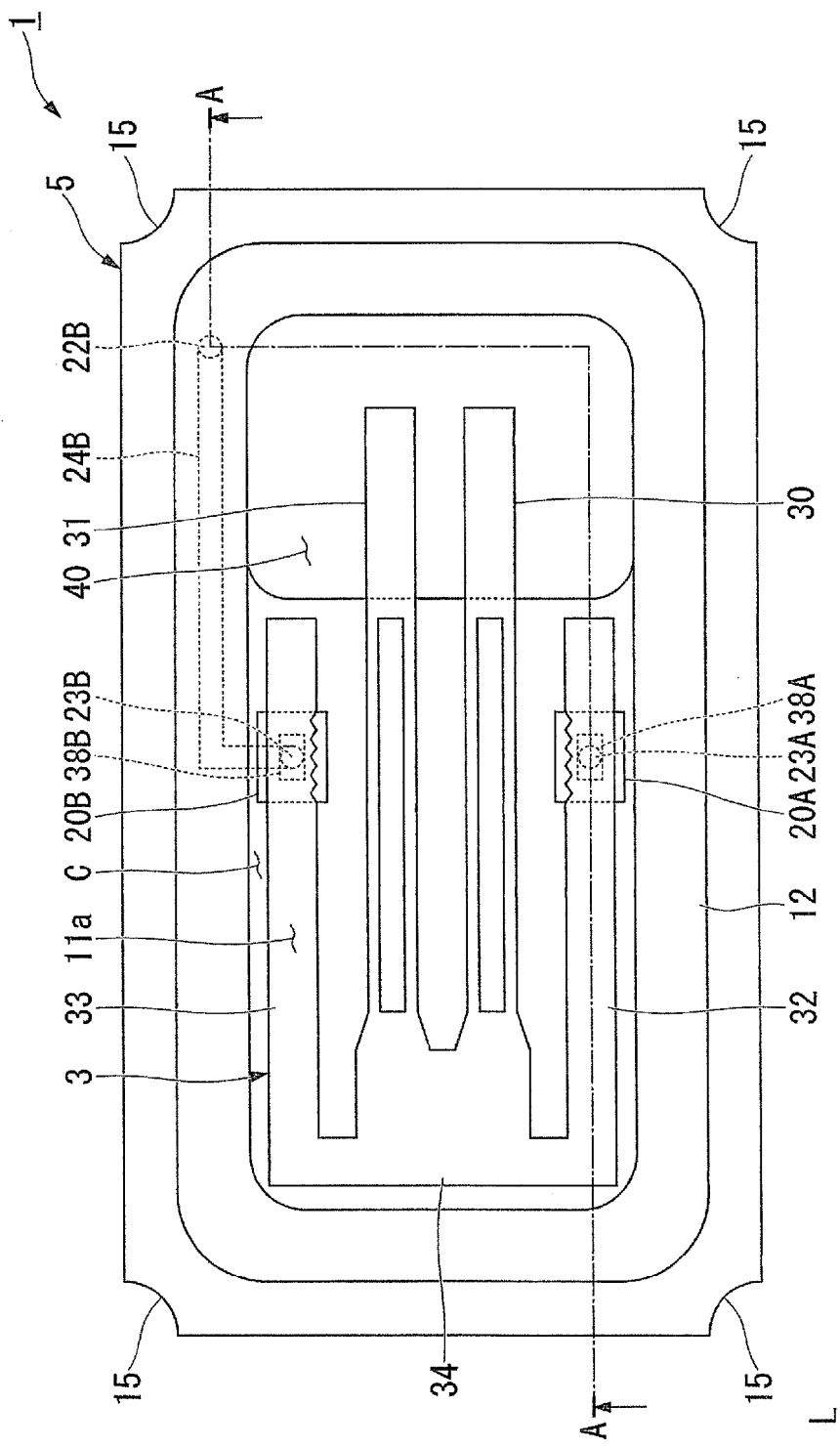
FIG. 2 is an internal structural view of the piezoelectric vibrator, which is a view of the piezoelectric vibrating piece seen from above in a state of removing a sealing plate.
Figure 3:
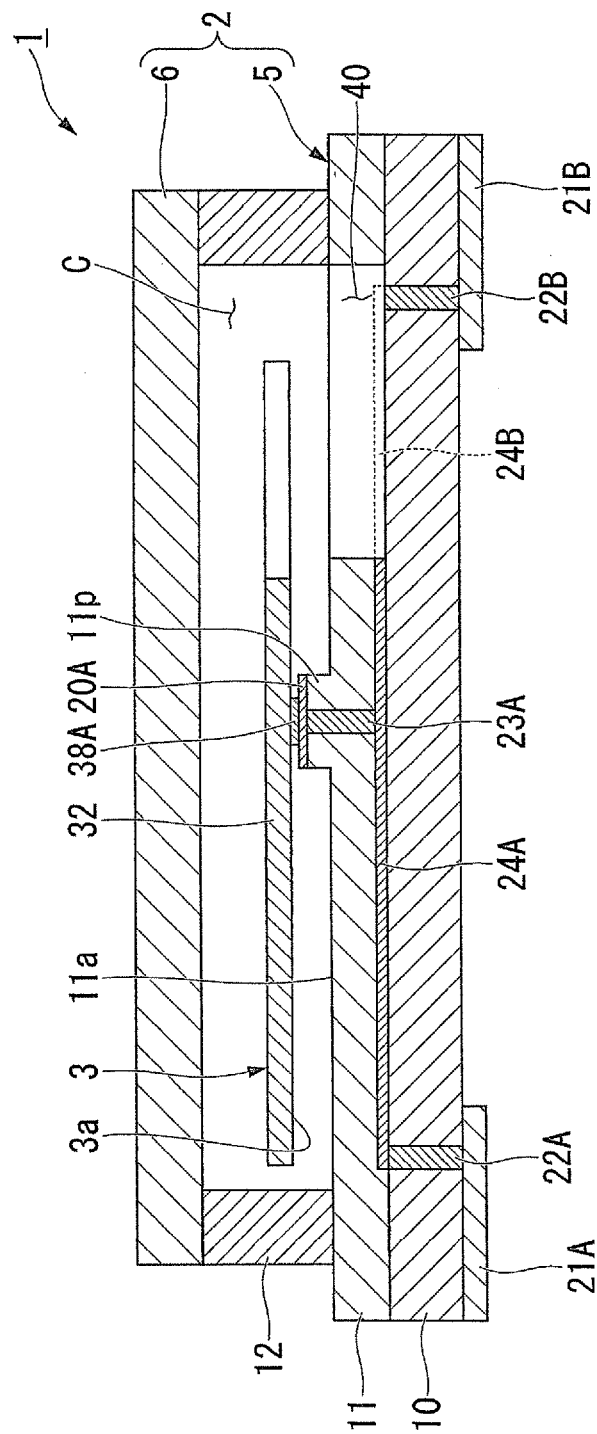
FIG. 3 is a cross-sectional view of the piezoelectric vibrator shown in FIG. 2 taken along A-A line.
Figure 4:
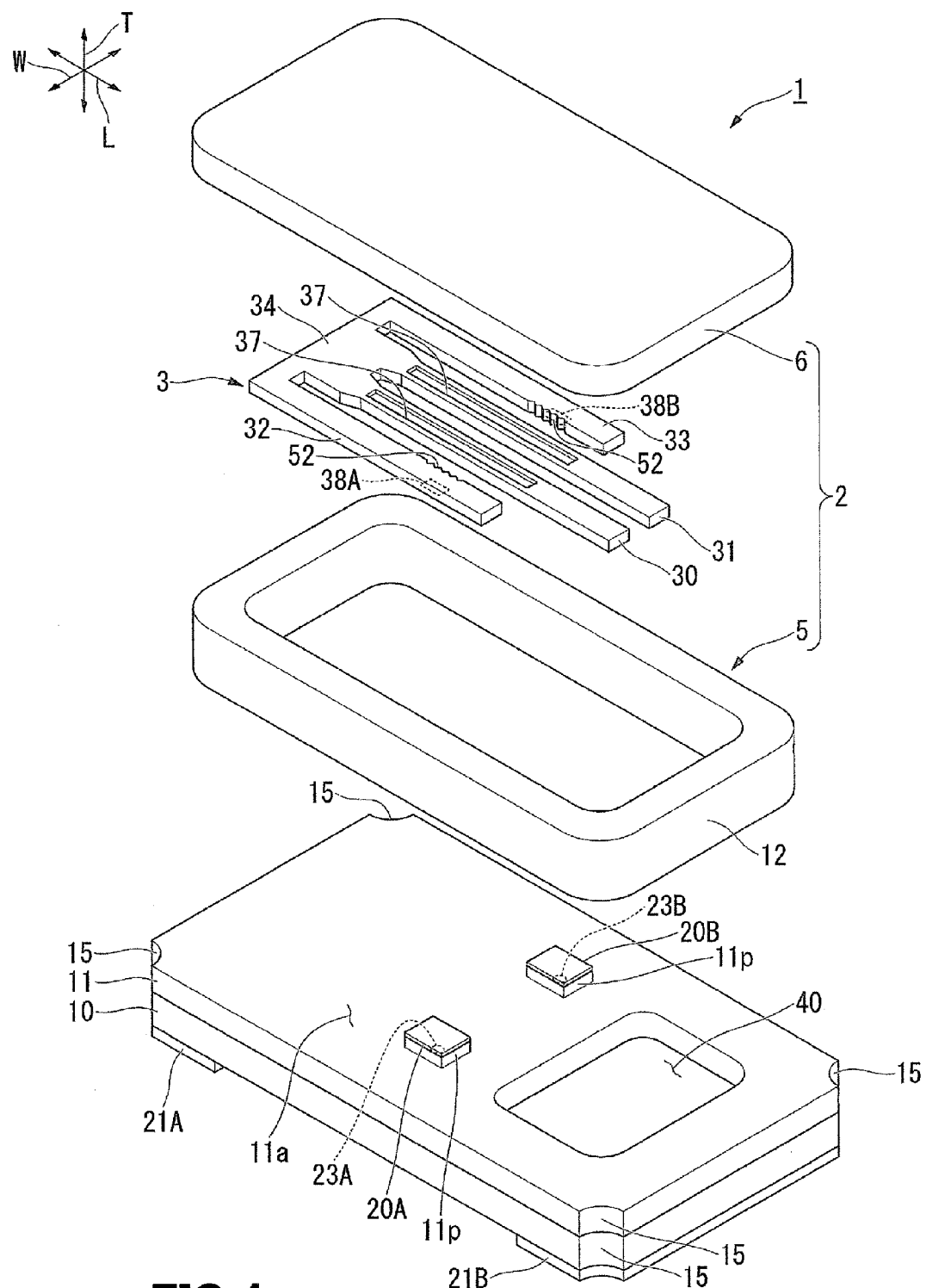
FIG. 4 is an exploded perspective view of the piezoelectric vibrator shown in FIG. 1.

FIG. 1 is an external perspective view of a piezoelectric vibrator, FIG. 2 is an internal structural view of the piezoelectric vibrator, which is a view of the piezoelectric vibrating piece seen from above in a state of removing a sealing plate, FIG. 3 is a cross-sectional view taken along A-A line of FIG. 2 and FIG. 4 is an exploded perspective view of the piezoelectric vibrator.

As shown in FIG. 1 to FIG. 4, a piezoelectric vibrator 1 according to the embodiment is a ceramic-package type surface mounted vibrator, which includes a package 2 having a hermetically sealed cavity C thereinside and a tuning-fork piezoelectric vibrating piece 3 housed in the cavity C.

The piezoelectric vibrator 1 is formed in an approximately rectangular parallelepiped shape, in which a longitudinal direction of the piezoelectric vibrator 1 is defined as a longitudinal direction L, a short side direction is defined as a width direction W and a direction orthogonal to the longitudinal direction L and the width direction W is defined as a thickness direction T in a plan view in the present embodiment.

The package 2 includes a package body 5 and a sealing plate 6 bonded to the package body 5 and forming the cavity C with respect to the package body 5.

The package body 5 includes a first base substrate 10 and a second base substrate 11 bonded in an overlapping state, and a sealing ring 12 bonded onto the second base substrate 11.

The first base substrate 10 is a ceramic substrate formed in an approximately rectangular shape in a plan view. The second base substrate 11 is a ceramic substrate formed in the approximately rectangular shape in a plan view which is the same external shape as the first base substrate 10, which is integrally bonded in a state of overlapping with the first base substrate 10 by a method of sintering and the like.

At four corners of the first base substrate 10 and the second base substrate 11, notch portions 15 with a ¼ arc shape in a plan view are formed over the thickness direction T of both substrates 10 and 11. These first base substrate 10 and the second base substrate 11 are fabricated by bonding two pieces of wafer-shaped ceramic substrates in the overlapping state and forming plural through holes piercing both ceramic substrates in line, then, by cutting both ceramic substrates in a lattice state while using respective through holes as references. At this time, each through hole is divided into four, therefore, the notch portions 15 are formed.

An upper surface of the second base substrate 11 is a mount surface 11a corresponding to an inner wall on which the piezoelectric vibrating piece 3 is mounted.

The first base substrate 10 and the second base substrate 11 are made of ceramic. As specific ceramic materials, for example, HTCC (High Temperature Co-Fired Ceramic) made of aluminum, LTCC (Low Temperature Co-Fired Ceramic) made of glass ceramic and so on can be cited.

The sealing ring 12 is a conductive frame-shaped member which is slightly smaller than the external shape of the first base substrate 10 and the second base substrate 11, which is bonded to the mount surface 11a of the second base substrate 11. Specifically, the sealing ring 12 is bonded onto the mount surface 11a by baking using brazing materials such as silver brazing, a solder material and so on, or bonded by welding with respect to a metal bonding layer formed on the mount surface 11a (for example, by using deposition, sputtering and so on in addition to electroplating and electroless plating).

As materials of the sealing ring 12, for example, nickel based alloys and so on can be cited, specifically, the material can be selected from Kovar, Elinvar, Invar, 42-alloy and so on. In particular, it is preferable to select a material having a thermal expansion coefficient close to the first base substrate 10 and the second substrate 11 made of ceramic as the material of the sealing ring 12. For example, when alumina having a thermal expansion coefficient of $6.8 \times 10^{-6}/°$ C. is used as the first base substrate 10 and the second substrate 11, Kovar having a thermal expansion coefficient of $5.2 \times 10^{-6}/°$ C. or 42-alloy having a thermal expansion coefficient of 4.5 to $6.5 \times 10^{-6}/°$ C. is preferably used as the material of the sealing ring 12.

The sealing plate 6 is a conductive substrate overlapping with the sealing ring 12, which is hermetically bonded to the package body 5 by the bonding with respect to the sealing ring 12. Then, a space demarcated by the sealing plate 6, the sealing ring 12 and the mount surface 11a of the second base substrate 11 functions as the cavity C which is hermetically sealed.

As a method of welding the sealing plate 6, seam welding performed by, for example, contacting a roller electrode, laser welding, ultrasonic welding and so on can be cited. In order to allow the welding between the sealing plate 6 and the sealing ring 12 to be more secure, it is preferable that bonding layers made of nickel, gold or the like which are adaptable to each other are respectively formed at least on a lower surface of the sealing plate 6 and an upper surface of the sealing ring 12.

Incidentally, a pair of electrode pads 20A and 20B which are connecting electrodes with respect to the piezoelectric vibrating piece 3 are formed on the mount surface 11a of the second base substrate 11 at an interval in the longitudinal direction L as well as a pair of external electrodes 21A and 21B are formed on a lower surface of the first base substrate 10 at an interval in the longitudinal direction L. These electrode pads 20A and 20B and the external electrodes 21A and 21B are single layer films each made of a single metal formed by, for example, deposition, sputtering and the like, or laminated films formed by staking different metals, which are conducted with one another.

That is, in the first base substrate 10, one first through electrode 22A conducted to one external electrode 21A and piercing the first base substrate 10 in the thickness direction T is formed. In the second base substrate 11, one second through electrode 23A conducted to one electrode pad 20A and piercing the second base substrate 11 in the thickness direction T is formed. One connecting electrode 24A connecting one first through electrode 22A and one second through electrode 23A is formed between the first base substrate 10 and the second base substrate 11. Accordingly, one electrode pad 20A and one external electrode 21A are conducted to each other.

Also, in the first base substrate 10, the other first through electrode 22B conducted to the other external electrode 21B and piercing the first base substrate 10 in the thickness direction T is formed. In the second base substrate 11, the other second through electrode 23B conducted to the other electrode pad 20B and piercing the second base substrate 11 in the thickness direction T is formed. The other connecting electrode 24B connecting the other first through electrode 22B and the other second through electrode 23B is formed between the first base substrate 10 and the second base substrate 11. Accordingly, the other electrode pad 20B and the other external electrode 21B are conducted to each other.

The other connecting electrode 24B is patterned, for example, so as to extend below the sealing ring 12 along the sealing ring 12 for avoiding a later-described concave portion 40.

The concave portion 40 is formed at a portion facing tip ends 30a and 31a of a later-described pair of vibrating arm portions 30 and 31 of the piezoelectric vibrating piece 3 on the mount surface 11a of the second base substrate 11. The concave portion 40 is provided for avoiding contact with respect to the tip ends 30a and 31a of the vibrating arm portions 30 and 31 when the vibrating arm portions 30 and 31 are displaced (bending deformation) in the thickness direction T due to the effect of a shock such as a fall. The concave portion 40 is a through hole piercing the second base substrate 11 and formed in a square shape in a plain view with a curved four corners inside the sealing ring 12.

(Piezoelectric Vibrating Piece)

The piezoelectric vibrating piece 3 is a tuning-fork vibrating piece formed of a piezoelectric material such as crystal, lithium tantalite or lithium niobate, which vibrates when a given voltage is applied. The piezoelectric vibrating piece 3 includes the pair of vibrating arm portions 30 and 31 extending along the longitudinal direction L in parallel to each other, tip sides of which in the extending direction are free ends vibrating by setting base end sides as fixed ends, a base portion 34 extending in the width direction W to both outer sides of the pair of vibrating arm portions 30 and 31, to which respective base ends of the pair of vibrating arm portions 30 and 31 are integrally connected and fixed, and a pair of support arm portions 32 and 33 connecting to the base portion 34 outside the pair of vibrating arm portions 30 and 31 and extending from the base portion 34 to the same side as the vibrating arm portions 30 and 31.

The shape of the piezoelectric vibrating piece 3 is not limited to this, and can be a shape in which, for example, the vibrating arm portions 30 and 31 extend with an inclination of 5 degrees at the maximum with respect to the longitudinal direction L. That is, the shape of the piezoelectric vibrating piece 3 is not particularly limited as long as there are the vibrating arm portions 30 and 31 provided at an interval in the width direction W of the base portion, and the support arm portions 32 and 33 are provided on both outer sides thereof.

The pair of vibrating arm portions 30 and 31 may belong to a hammer head type, for example, in which a width dimension on tip end side is expanded as compared with the base end side. In the case of applying the hammer head type, the weight of the tip end side of the vibrating arm portions 30, 31 and the moment of inertia at the time of vibration can be increased, accordingly, the vibrating arm portions 30 and 31 are easily vibrated and the length of the vibrating arm portions 30 and 31 can be shortened, thereby reducing the size.

The pair of vibrating arm portion 30 and 31 include groove portions 37 respectively formed along the longitudinal direction (extending direction) L of the vibrating arm portion 30 and 31 on both surfaces in the thickness direction T. The groove portions 37 are formed, for example, in a space from the base end side of the vibrating arm portion 30, 31 to approximately the center thereof in the longitudinal direction L.

On surfaces of the pair of vibrating arm portions 30 and 31, not-shown two-system excitation electrodes which are insulated from each other and vibrate the vibrating arm portions 30 and 31 in the width direction W are arranged.

Figure 5:
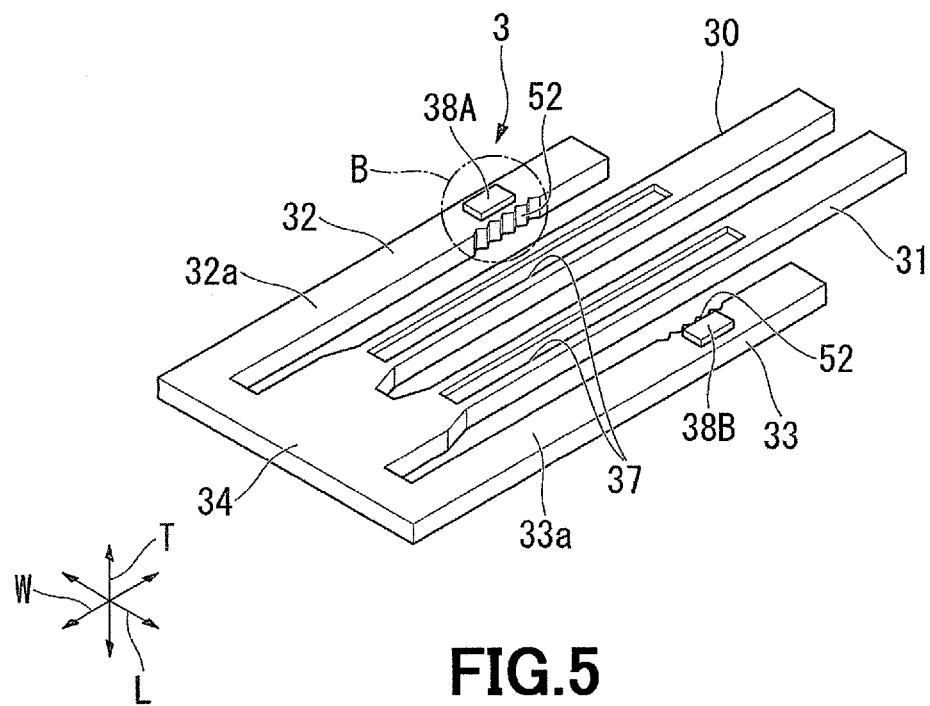
FIG. 5 is a plan view of the piezoelectric vibrating piece on the mount surface side according to the embodiment of the present invention.

FIG. 5 is a plan view of the piezoelectric vibrating piece on the mount surface side.

As shown in the drawing, the respective mount electrodes 38A and 38B are provided on one-side surfaces 32a, 33a (hereinafter referred to as "mount surfaces") of two surfaces of the support arm portions 32 and 33 facing in a thickness direction as mount portions used when the piezoelectric vibrating piece 3 is mounted on the package 2. These mount electrodes 38A and 38B are arranged near tip ends of the respective support arm portions 32 and 33.

The respective mount electrodes 38A, 38B and respective excitation electrodes 35, 36 are conducted to each other by not-shown layout electrodes, and these conductive portions are formed by being continuously patterned.

Figure 6:
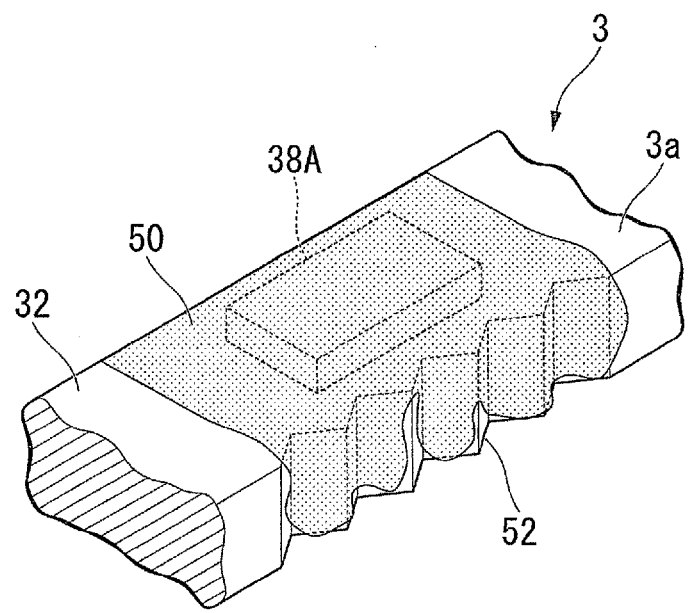
FIG. 6 is an enlarged view for explaining the effect of a portion B in FIG. 5.

In areas where the conductive bonding material can be adhered in the peripheries of the mount electrodes 38A and 38B on the respective support arm portions 32 and 33, namely, the areas where a conductive adhesive 50 applied to a range including the mount electrode 38A (38B) can be adhered at the time of bonding the mount electrodes 38A and 38B to the electrode pads 20A and 20B (see FIG. 3) on the package 2 side by using the paste conductive adhesive 50 as shown in FIG. 6, concave portions 52 into which the conductive adhesive 50 can penetrate are formed.

More specifically, when the piezoelectric vibrating piece 3 is mounted on the package 2, the conductive adhesive 50 is applied to respective mount electrodes 38A and 38B or the pair of electrode pads 20A and 20B to thereby mount the piezoelectric vibrating piece 3 on the package 2. At this time, the conductive adhesive 50 is squeezed and wet-spread. The concave portions 52 into which the conductive adhesive 50 can penetrate are formed at the areas where the conductive adhesive 50 is wet-spread (areas to which the applied conductive adhesive 50 can be adhered).

In the embodiment, plural concave portions 52 each having a shape of a groove extending along a thickness direction into which the conductive adhesive 50 coming from the mount surface 32a (33a) penetrates are formed as the areas to which the applied conductive adhesive 50 can be adhered in side end surfaces on inner sides in the width direction of respective support arm portions 32 (33). That is, the concave portions 52 piercing from one surface to the other surface of each support arm portion 32 (33) are formed. The plural concave portions 52 in this case are continuously formed in a sawtooth shape, however, it is not limited to this form and it is sufficient that at least one concave portion is formed.

The piezoelectric vibrating piece 3 having the above structure is housed in the hermetically sealed cavity C of the package 2, and the two mount electrodes 38A and 38B provided on the mount surfaces 32a and 33a of the support arm portions 32 and 33 of the piezoelectric vibrating piece 3 are connected electrically and mechanically to the two electrode pads 20A and 20B provided on the mount surface 11a of the second base substrate 11 of the package 2 respectively through the conductive adhesive.

Accordingly, the piezoelectric vibrating piece 3 is supported by the support arm portions 32 and 33 in a state of floating from the mount surface 11a of the second base substrate 11, and the base end side of the pair of vibrating arm portions 30 and 31 are supported in a cantilever manner through the base portion 34.

Then, when a given voltage is applied to the external electrodes 21A and 21B, electric current flows in the pair of excitation electrodes 35 and 36, and the pair of vibrating arm portions 30 and 31 vibrate in directions approaching and separating from each other (width direction W) at a given resonance frequency due to the interaction between the excitation electrodes 35 and 36. The vibration of the pair of vibrating arm portions 30 and 31 is used as a time source, a timing source of a control signal, a reference signal source and so on.

As the conductive bonding material for bonding the mount electrodes 38A and 38B to the electrode pads 20A and 20B, metal bumps can be used instead of the conductive adhesive. A common point between the conductive adhesive and the metal bumps is that they are paste conductive bonding materials having fluidity in an initial stage of bonding and are solidified in a later stage of bonding to develop the bonding strength.

In the piezoelectric vibrating piece 3 and the piezoelectric vibrator 1 having the above structure, the conductive adhesive 50 penetrates from the mount surface 32a (33a) as the surface of the support arm portion 32 (33) on which the mount electrode 38A (38B) is formed into the concave portions 52 as shown in an enlarged view of FIG. 6, thereby expanding the bonding area between the conductive adhesive 50 and the piezoelectric vibrating piece 3, which increases the bonding strength between the conductive adhesive 50 and the piezoelectric vibrating piece 3. As a result, the strength in mounting the piezoelectric vibrating piece 3 on the package 2 can be increased.

As the concave portions 52 are provided in the support arm portions 32 and 33, the stress of the support arm portions 32 and 33 occurring at the time of mounting the piezoelectric piece 3 can be alleviated at portions where the concave portions 52 are provided. As a result, stable vibration characteristics can be maintained. That is, even when the mounting is performed in a state where the support arm portions 32 and 33 bend at the time of mounting, the deformation can be absorbed in the concave portions 52. When the mounting is performed in the bent state, problems that the piezoelectric vibrating piece 3 comes off after the mounting and that vibration characteristics of the piezoelectric vibrating piece 3 are reduced may occur, however, there is no danger that such problems occur as the bending can be absorbed in the concave portions 52, in other words, the internal stress of the support arm portion 32 (33) can be alleviated by the bending deformation.

Also, as the concave portions 52 are provided in the support arm portions 32 and 33, the effect of vibration attenuation can be fulfilled at the portions where the concave portions 52 are formed. Accordingly, it is possible to prevent transmission of vibration generated in the vibrating arm portions 30 and 31 to the package 2 side through the mount electrodes 30A and 30B as much as possible, thereby obtaining the effect of vibration leakage prevention.

In this case, the plural concave portions 52 are provided in the sawtooth shape in the side end surfaces of respective support arm portions 32 and 33 in the width direction W which is a vibration direction of the vibrating arm portions 30 and 31, therefore, the bonding strength can be increased as well as the effect of vibration attenuation can be further obtained and the effect of vibration leakage prevention can be increased. In particular, as the concave portions 52 are provided in the side end surfaces on the inner sides in the width direction of respective support arm portions 32 and 33, a bending performance on the inner sides in the width direction of the support arm portions 32 and 33 in which the concave portions 52 are provided is increased and the effect of absorbing vibration transmitted from the vibrating arm portions 30 and 31 arranged inside the pair of support arm portions 32 and 33 can be increased. Also, as the concave portions 52 are arranged in the side end surfaces inside the support arm portions 32 and 33, the conductive adhesive 50 reaching the side end surfaces penetrates into the concave portions 52, therefore, the possibility that the conductive adhesive 50 adheres to the vibrating arm portions 30 and 31 at the time of mounting is reduced.

(Oscillator)

Next, an example of an oscillator using the piezoelectric vibrator according to the embodiment of the present invention will be explained with reference to FIG. 9.

Figure 9:
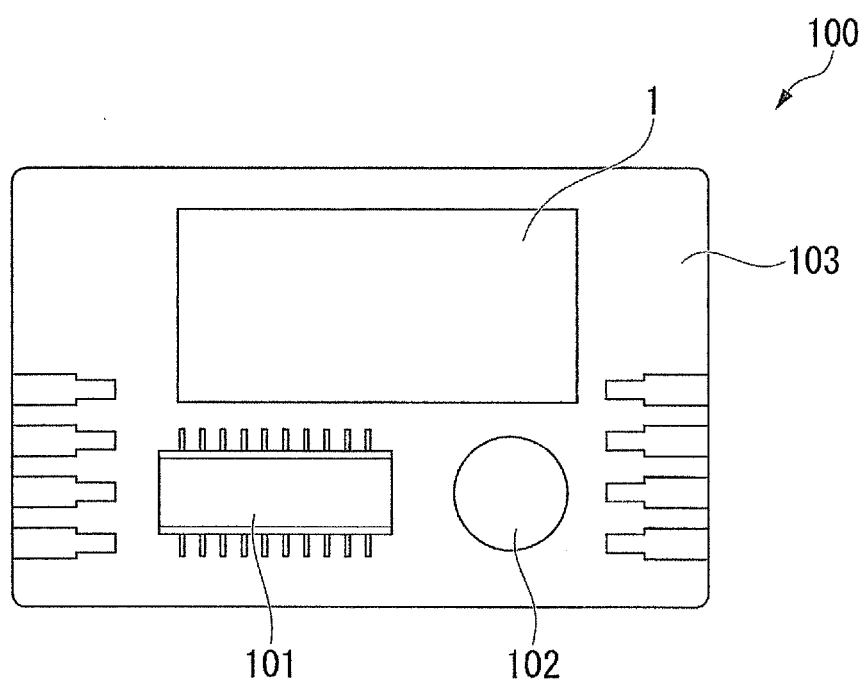
FIG. 9 is a structural view showing an oscillator using the piezoelectric vibrator according to the embodiment of the present invention.

FIG. 9 is a structural view showing an oscillator using the above piezoelectric vibrator.

As shown in the drawing, an oscillator 100 uses the piezoelectric vibrator 1 as a resonator which is electrically connected to an integrated circuit 101.

The oscillator 100 includes a substrate 103 on which an electronic component 102 such as a capacitor is mounted. The above integrated circuit 101 for the oscillator is mounted on the substrate 103, and the piezoelectric vibrator 1 is mounted in the vicinity of the integrated circuit 101. The electronic component 102, the integrated circuit 101 and the piezoelectric vibrator 1 are electrically connected respectively by a not-shown wiring pattern. Respective components are molded by a not-shown resin.

In the oscillator 100 having the above structure, the piezoelectric vibrating piece in the piezoelectric vibrator 1 vibrates when a voltage is applied to the piezoelectric vibrator 1. The vibration is converted into an electric signal by piezoelectric characteristics possessed by the piezoelectric vibrating piece and inputted to the integral circuit 101 as the electric signal. Various processing is performed to the inputted electric signal by the integral circuit 101 to be outputted as a frequency signal. Accordingly, the piezoelectric vibrator 1 functions as the resonator.

In the configuration of the integrate circuit 101, for example, an RTC (real time clock) module or the like is selectively set according to a request, thereby adding functions such as the control of an operation date and time of the device and outer devices, presentation of time or a calendar and so on in addition to a single function oscillator for clocking.

As the oscillator 100 has the piezoelectric vibrator 1 as described above, the oscillator 100 effectively capable of suppressing vibration leakage can be obtained in the same manner.

(Electronic Device)

Next, an example of an electronic device using the piezoelectric vibrator according to the embodiment of the present invention will be explained with reference to FIG. 10.

Figure 10:
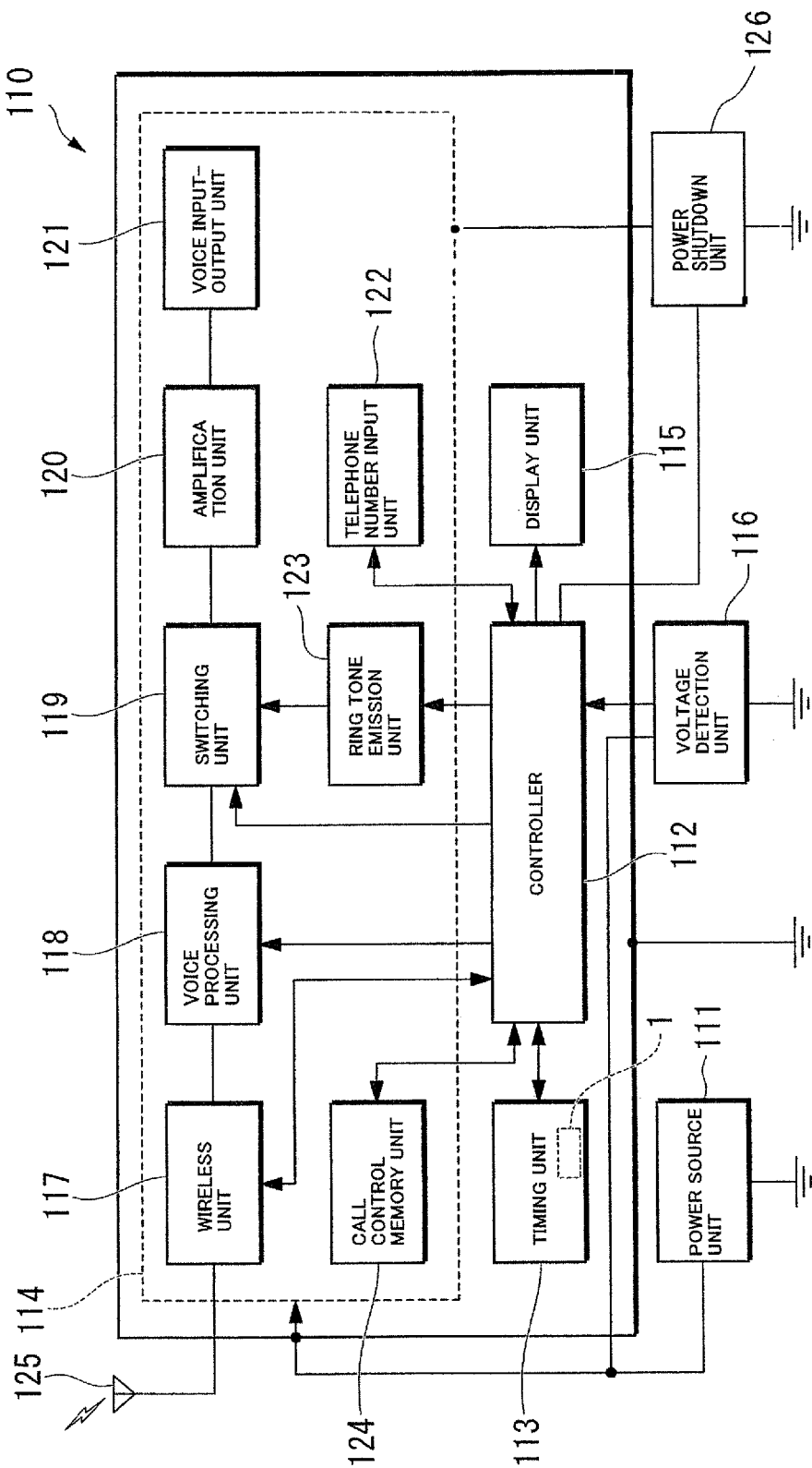
FIG. 10 is a structural view showing an electronic device using the piezoelectric vibrator according to the embodiment of the present invention.

FIG. 10 is a structural view showing an electronic device using the above piezoelectric vibrator.

As shown in the drawing, the electronic device is a portable information device 110 using the piezoelectric vibrator 1, which is typified by, for example, a cellular phone obtained by developing and improving a wrist watch in related art. The device looks like a wrist watch, in which a liquid crystal display is arranged at a portion corresponding to a dial and the current time and so on can be displayed on a screen. When using the device as a communication device, it is possible to perform communication in the same manner as the related-art cellular phone using a speaker and a microphone built in an inner side portion of a band by removing the band from a wrist. However, the device is drastically reduced in size and weight as compared with the related-art cellular phone.

Next, a configuration of the portable information device 110 will be explained. The portable information device 110 includes the piezoelectric vibrator 1 and a power supply unit 111 for supplying the power as shown in FIG. 10. The power supply unit 111 is formed of, for example, a lithium secondary battery. A control unit 112 performing various kinds of control, a timing unit 113 counting the time and so on, a communication unit 114 performing communication with the outside, a display unit 115 displaying various information and a voltage detecting unit 116 detecting voltages of respective functional units are connected to the power supply unit 111 in parallel. Then, the power is supplied to respective functional units by the power supply unit 111.

The control unit 112 controls respective functional units to perform operation control of the entire system such as transmission/reception of audio data, measurement and display of current time. The control unit 112 includes, a ROM in which programs are previously written, a CPU reading and executing the programs written in the ROM, a RAM used as a work area of the CPU and so on.

The timing unit 113 has an integrated circuit including an oscillation circuit, a register circuit, a counter circuit and an interface circuit and the piezoelectric vibrator 1. When a voltage is applied to the piezoelectric vibrator 1, the piezoelectric vibrating piece vibrates, and the vibration is converted into an electric signal by piezoelectric characteristics possessed by crystal to be inputted to the oscillation circuit as the electric signal. An output of the oscillation circuit is binarized and counted by the register circuit and the counter circuit. Then, the signal is transmitted/received with respect to the control unit 112 through the interface circuit, thereby displaying the current time, the current date or calendar information and the like on the display unit 115.

The communication unit 114 has the same functions as those of the related-art cellular phone, including a wireless portion 117, an audio processing unit 118, a switching unit 119, an amplification unit 120, an audio input/output unit 121, a telephone-number input unit 122, an incoming sound generation unit 123 and a call control memory unit 124.

The wireless unit 117 transmits and receives various data such as audio data with respect to a base station through an antenna 125. The audio processing unit 118 encodes and decodes an audio signal inputted from the wireless unit 117 or the amplification unit 120. The amplification unit 120 amplifies the signal inputted from the audio processing unit 118 or the audio input/output unit 121 to a given level. The audio input/output unit 121 includes a speaker, a microphone and the like, which increases the incoming sound and the call volume as well as collects sound.

The incoming sound generation unit 123 generates the incoming sound in accordance with the calling from the base station. The switching unit 119 switches the amplification unit 120 connected to the audio processing unit 118 to the incoming sound generation unit 123 only when a call is coming, thereby outputting the incoming sound generated in the incoming sound generation unit 123 to the audio input/output unit 121 through the amplification unit 120.

The call control memory unit 124 stores programs relating to the control of call transmission/reception in the communication. The telephone-number input unit 122 includes, for example, number keys from 0 (zero) to 9 and other keys, and a telephone number of a call destination is inputted by pressing the number keys and so on.

The voltage detecting unit 116 detects a voltage reduction and notifies the control unit 112 of the reduction when the voltage added to respective functional units such as the control unit 112 by the power supply unit 111 is reduced to be lower than a given value. The given voltage value at this time is a predetermined value as a minimum necessary voltage for stably operating the communication unit 114, which is, for example, approximately 3V. The control unit 112 which has received the notification of voltage reduction from the voltage detecting unit 116 inhibits operations of the wireless unit 117, the audio processing unit 118, the switching unit 119 and the incoming sound generation unit 123. In particular, it is essential to stop the operation of the wireless unit 117 with high power consumption. Furthermore, a notice indicating that the communication unit 114 is inoperable due to shortage of a battery remaining amount is displayed in the display unit 115.

That is, the operation of the communication unit 114 can be inhibited and the fact can be displayed in the display unit 115 by the voltage detecting unit 116 and the control unit 112. The display may be a massage of letters as well as may be performed by putting a mark "X" on a telephone icon displayed on an upper part of a display surface in the display unit 115 as a more instinctive display.

Note that a power shutdown unit 126 which can selectively shut down the power at a portion relating to the function of the communication unit 114 is provided to thereby stop the function of the communication unit more positively.

As the portable information device 110 has the above piezoelectric vibrator 1 as described above, the portable information device 110 which can suppress the vibration leakage effectively can be obtained in the same manner.

(Radio Timepiece)

Next, a radio timepiece using the piezoelectric vibrator according to the embodiment of the present invention will be explained with reference to FIG. 11.

Figure 11:
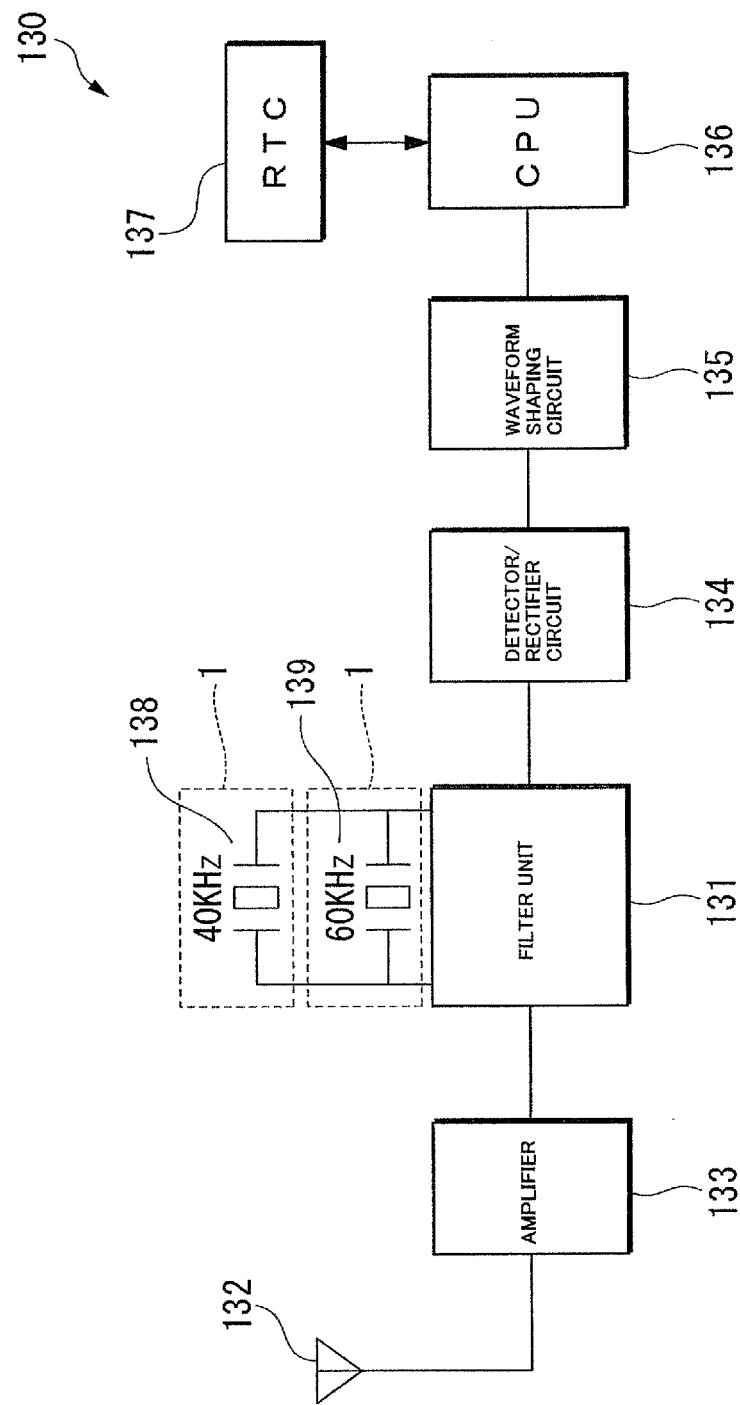
FIG. 11 is a structural view showing a radio timepiece using the piezoelectric vibrator according to the embodiment of the present invention.

FIG. 11 is a structural view showing a radio timepiece using the above piezoelectric vibrator.

As shown in the drawing, a radio timepiece 130 has the piezoelectric vibrator 1 electrically connected to a filter unit 131, which is a time piece having functions of receiving a standard wave including timepiece information and displaying the precise time after automatic correction.

In Japan, transmitting stations transmitting standard waves exist in Fukushima prefecture (40 kHz) and Saga prefecture (60 kHz), which transmit standard waves respectively. Long waves such as 40 kHz and 60 kHz have both a characteristic of propagating on the ground surface and a characteristic of propagating while being reflected on the ionosphere and the ground surface, therefore, the propagation range is wide enough to cover the entire Japan by the above two transmitting stations.

Hereinafter, a functional configuration of the radio timepiece 130 will be explained in detail.

The antenna 132 receives a long standard wave of 40 kHz or 60 kHz. The long standard wave includes time information called a time code, which is obtained by amplitude-modulating a carrier wave of 40 kHz or 60 kHz. The received long standard wave is amplified by an amplifier 133 and filtered/synchronized by a filter unit 131 having plural piezoelectric vibrators 1.

The piezoelectric vibrator 1 used for the radio timepiece 130 has quartz crystal units 138 and 139 having resonance frequencies of 40 kHz and 60 kHz which are the same as the above-described carrier frequencies, respectively.

The filtered signal with the given frequency is detected and demodulated by a detection/rectifier circuit 134. Subsequently, the time code is taken out through a waveform shaping circuit 135 and counted by a CPU 136. In the CPU 136, information such as a current year, cumulative days, a day of the week, time is read. The read information is reflected on an RTC 137, and precise time information is displayed.

As the carrier waves are 40 kHz and 60 kHz, it is preferable to use the above vibrator having the tuning-fork type structure as the quartz crystal units 138 and 139.

Although the above explanation has been made by citing the example of Japan, frequencies of long standard waves differ in foreign countries. For example, a standard wave of 77.5 kHz is used in Germany. Accordingly, when the radio timepiece 130 which can be used in foreign countries is incorporated in portable devices, the piezoelectric vibrator 1 having a frequency different from that of Japan is necessary.

As the radio timepiece 130 has the above piezoelectric vibrator 1 as described above, the radio timepiece 130 which can suppress the vibration leakage effectively can be obtained in the same manner.

The embodiments of the present invention have been explained with reference to the drawings, however, specific configurations are not limited to these embodiments and design change in a range not departing from the gist of the present invention and so on are included.

For example, the case where the concave portions 52 are formed in the side end surfaces on the inner sides in the width direction of the support arm portions 32 and 33 has been shown in the above embodiment, however, it is also preferable that the concave portions are formed in the side end surfaces on the outer sides in the width direction of the support arm portions 32 and 33 as well as it is preferable that the concave portions 52 are formed in both side end surfaces on the inner sides and outer sides in the width direction of the support arm portions 32 and 33.

The concave portions 52 may have shapes, for example, in which the conductive adhesive 50 applied to the mount surfaces 32a and 33a can penetrate at the time of mounting and so on. The shape is desirably the groove shape extending along the thickness direction as in the above embodiment when the concave portions are formed in the side end surfaces, however, it is not always necessary to form the concave portions in the groove shape.

First Modification Example

Figure 7:
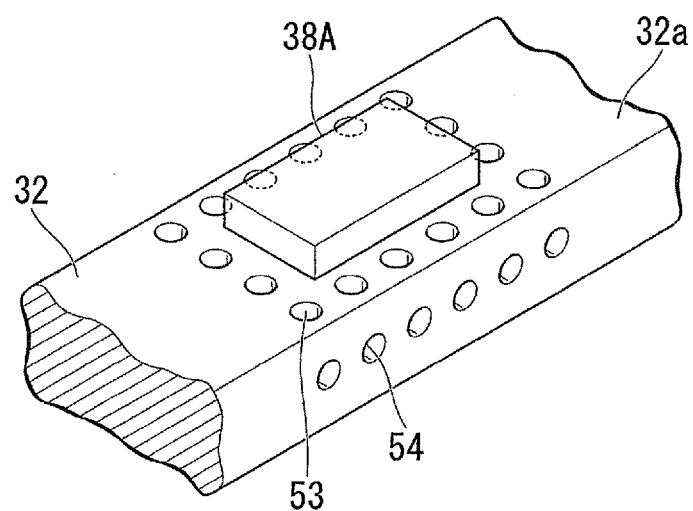
FIG. 7 is an enlarged perspective view of a relevant part of a first modification example in the embodiment of the present invention.

For example, it is also preferable to form concave portions 53 having shapes such as a circular shape and a polygonal shape in a scattered manner when formed on the mount surface 32a (33a) as in an example shown in FIG. 7. Concave portions 54 formed on the side end surface may be formed in the circular shape or the polygonal shape. The concave portions 53 formed on the mount surface 32a (33a) may pierce the support arm portion 32 (33) in the thickness direction.

Second Modification Example

Figure 8:
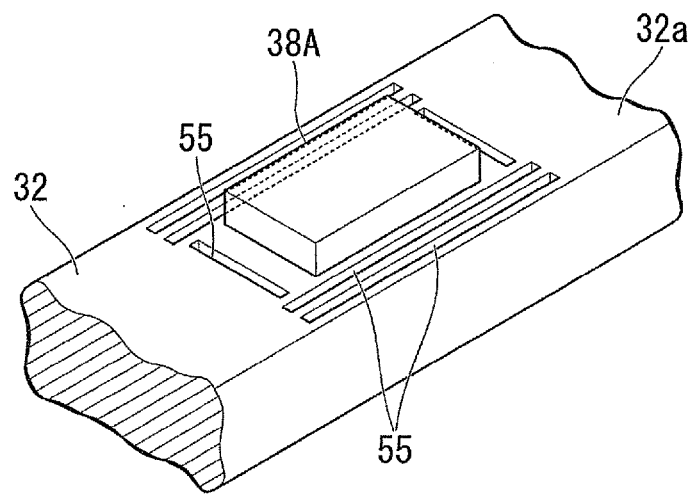
FIG. 8 is an enlarged perspective view of a relevant part of a second modification example in the embodiment of the present invention.

It is also possible to form slit-shaped concave portions 55 as in an example shown in FIG. 8 instead of the concave portions 54 having the circular shape or the polygonal shape as in the example shown in FIG. 7. The slit-shaped concave portions 55 may also pierce the support arm portion 32 (33) in the thickness direction when formed on the mount surface 32a (33a).

Additionally, the base substrate is formed of two substrates of the first base substrate 10 and the second base substrate 11 in the above embodiment, however, the base substrate may be formed of one substrate and the concave portion 40 is formed on the mount surface 11a. However, it is preferable that the base substrate is formed of two substrates of the first base substrate 10 and the second base substrate 11. In this case, the concave portion 40 can be easily formed by bonding both base substrates after forming a through hole in the second base substrate 11, therefore, the process and time for forming the concave portion can be reduced.

It is also possible to form the concave portions for absorbing vibration in side portions in the width direction of the vibrating arm portions 30 and 31 on the base end side or side portions in the width direction of the support arm portions 32 and 33 on the base end side in the piezoelectric vibrating piece 3, thereby facilitating the attenuation of vibration transmitted from the vibrating arm portions 30 and 31 to the support arm portions 32 and 33. Accordingly, it is possible to prevent vibration leakage (leakage of vibration energy) from the piezoelectric vibrating piece 3 to the package 2 side, thereby stabilizing the resonance frequency of the piezoelectric vibrating piece 3.

What is claimed is:

1. A piezoelectric vibrating piece comprising:
a pair of vibrating arm portions at an interval in a width direction orthogonal to a thickness direction and extending in a longitudinal direction orthogonal to the thickness direction and the width direction, each of the vibrating arm portions having tip end sides in the longitudinal direction that comprise vibrating free ends and fixed base end sides;
a base portion extending in the width direction to outer sides of the pair of vibrating arm portions, to which respective base end sides of the pair of vibrating arm portions are integrally connected and fixed;
a pair of support arm portions connected to the base portion outside the pair of vibrating arm portions and extending from the base portion to a same side as the pair of vibrating arm portions, the support arm portions having first and second opposing surfaces in the thickness direction and first and second opposing surfaces in the width direction; and
a pair of mount electrodes on a first surface of the opposing surfaces in the thickness direction of the respective support arm portions,
wherein the pair of mount electrodes are bonded to respective electrode pads on a package side housing the piezoelectric vibrating piece through a conductive bonding material, and
wherein concave portions extend into the pair of mount electrodes from the first surface toward the second surface of the opposing surfaces in the thickness direction in proximity to the mount electrodes, and a length of at least one concave portion in the longitudinal direction is less than a length of the mount electrode in the longitudinal direction, and the conductive adhesive overlies the mount electrodes and the concave portions.

2. The piezoelectric vibrating piece according to claim 1, wherein the at least one concave portion is in the first surface in the width direction of each support arm portion.

3. The piezoelectric vibrating piece according to claim 2, wherein the first surface in the width direction is on a vibrating arm portion side of each support arm portion.

4. A piezoelectric vibrator in which the piezoelectric vibrating piece according to claim 1 is housed in a hermetically sealed cavity of a package,
wherein the two mount electrodes are respectively bonded to the two electrode pads through the conductive adhesive to thereby mount the piezoelectric vibrating piece on the package so that bonded portions are set as support fixing points and that other portions float from the package.

* * * * *